(12) United States Patent
Kobayashi

(10) Patent No.: US 7,659,932 B2
(45) Date of Patent: *Feb. 9, 2010

(54) SOLID STATE IMAGING APPARATUS AND ITS DRIVING METHOD

(75) Inventor: Makoto Kobayashi, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 472 days.

This patent is subject to a terminal disclaimer.

(21) Appl. No.: 11/604,795

(22) Filed: Nov. 28, 2006

(65) Prior Publication Data

US 2007/0126905 A1 Jun. 7, 2007

(30) Foreign Application Priority Data

Nov. 28, 2005 (JP) .............................. 2005-341686

(51) Int. Cl.
*H04N 5/335* (2006.01)

(52) U.S. Cl. ................... 348/311; 348/302; 348/281; 348/282; 348/294

(58) Field of Classification Search ............... 348/315, 348/322
See application file for complete search history.

(56) References Cited

U.S. PATENT DOCUMENTS

2006/0033829 A1* 2/2006 Ikeda et al. ................ 348/311
2006/0044441 A1* 3/2006 Parks ......................... 348/322
2006/0268139 A1* 11/2006 Kobayashi et al. .......... 348/294

FOREIGN PATENT DOCUMENTS

JP 10-136391 A 5/1998

OTHER PUBLICATIONS

Tetsuo Yamada et al.; A Progressive Scan CCD Imager for DSC Applications, ISSCC Digest of Technical Papers, Feb. 2000, pp. 110-111.

* cited by examiner

*Primary Examiner*—Jason Chan
*Assistant Examiner*—Antoinette T Spinks
(74) *Attorney, Agent, or Firm*—Birch, Stewart, Kolasch & Birch, LLP

(57) ABSTRACT

A solid-state imaging apparatus comprising a semiconductor substrate, a multiplicity of photo electric conversion elements, a vertical electric charge transfer device having a plurality of vertical electric charge transfer channels, reading out parts, each comprising a reading out electrode, wherein the reading out electrode and at least one of transfer electrodes adjoining to the reading out electrode are adjoining to same photo electric conversion element is characterized by that electric charge accumulated in each photo electric conversion element is transferred by every other line of vertical electric charge transfer channels in the vertical direction. The solid-state imaging apparatus can prevent color mixture even when the inter-VCCD blooming is occurred.

2 Claims, 6 Drawing Sheets

SOLID STATE IMAGING APPARATUS AND ITS DRIVING METHOD

CROSS REFERENCE TO RELATED APPLICATION

This application is based on Japanese Patent Application 2005-341686, filed on Nov. 28, 2005, the entire contents of which are incorporated herein by reference.

BACKGROUND OF THE INVENTION

A) Field of the Invention

This invention relates to a solid state imaging apparatus and more specifically to a driving method of a solid state imaging apparatus.

B) Description of the Related Art

FIG. 5 is a schematic plan view of a conventional solid state imaging apparatus 51.

The solid state imaging apparatus 51 is consisted of a light receiving region 52 including a multiplicity of photo electric conversion elements 52 and vertical electric charge transfer devices (vertical charge coupled devices: VCCD) 64 for transferring electric charges generated in the photo electric conversion elements in a vertical direction, a horizontal electric charge transfer device (horizontal charge coupled device: HCCD) 73, and an output amplifier 74.

The light receiving region 64 of the imaging device to which a pixel interleaved array CCD (PIACCD) is applied as shown in the drawing has the multiplicity of the photo electric conversion elements 52 arranged in so-called pixel interleaved arrangement. Between columns of the photo electric conversion elements 54, the vertical electric charge transfer device 64 that reads out electric charges generated in the photo electric conversion elements 54 and transfers them in the vertical direction is placed by sewing spaces between the photo electric conversion elements to the vertical direction. Winding transfer channels are formed in spaces formed by the pixel interleaved arrangement, and adjacent transfer channels are going away from each other via the photo electric conversion element 52 and coming closer to each other via a channel stop region 53. For example, the details of the pixel interleaved arrangement can be found in Japanese Laid-Open Patent Hei10-136391 and Tetsuo Yamada, et al, February, 2000, "A Progressive Scan CCD Imager for DSC Applications", ISSCC Digest of Technical Papers, Page 110 to 111.

The vertical electric charge transfer device 64 is consisted of the vertical transfer channel 54 shown in FIGS. 6A and in 6B and transfer electrodes 16a and 16b which are formed over the vertical transfer channel 54 via an insulating film 10a and wobbling the photo electric conversion elements 52 to the horizontal direction.

FIG. 6A is an enlarged plan view showing a part of the light receiving region 52 in the conventional solid-state imaging apparatus 51. FIG. 6B is an enlarged cross sectional view showing the conventional solid-state imaging apparatus 51 cut across a broken line A-B in FIG. 6A.

Each of the vertical transfer channel 54 is formed corresponding to each row of the photo electric conversion elements 52, and transfers the signal electric charges read out via a reading-out gate channel region 51c formed adjoining to each photo electric conversion element 52 to the vertical direction. A channel stop region 53 is positioned adjoining to the vertical transfer channel 54 on the opposite side of the reading-out gate channel region 51c. Moreover, the transfer electrodes 56 (the first layer poly-silicon electrode 56a and the second layer poly-silicon 56b) are formed over the vertical transfer channel 54 via the insulating film 60a. Furthermore, at the cross section of this part, only the second layer poly-silicon electrode 56b is positioned over the vertical transfer channel 54. Further, the conventional solid-state imaging apparatus 51 has a structure wherein the two vertical transfer channels 54 are adjoining via the channel stop regions 53.

During a reading-out period, the signal charges generated by the photo electric conversion elements (pixel) 52 are read out to the vertical transfer channels by impressing a high level voltage (VH) to the first layer poly-silicon electrode 56b (φV1) or 56d (φV3) equipped on the reading-out gate channel region (reading-out part) 51c.

Thereafter, during a transfer period, the signal charges are transferred to the HCCD 73 by sequentially impressing a mid-level pulse (VM) or a low-level pulse (VL) to the transfer electrodes 56a to 56d. A horizontal transfer of the electric charges by the HCCD 73 is executed by the two-phase drive with HM/HL pulses during a period between the transfer operations of the VCCD 64 in the transfer period.

FIG. 7 shows electric potentials between a broken line E-F in FIG. 6B. An overflow drain that discharges an excessive signal electric charge of the photo electric conversion elements 52 is formed by adding an inverse bias on an n-type substrate 51a to form an appropriate electric potential barrier between the photo electric conversion element 52 and the n-type substrate 51a.

In the drawing, the electric potential indicated with a solid line is in a condition that the electric charges are accumulated in the photo electric conversion element 52. Since a low voltage (VM or VL) is impressed on the electrode 56b, a reading part 51c is closed, and the accumulated signal charges are not read out to the vertical transfer channel 54.

In the drawing, the electric potential indicated with a dashed line is in a condition that a high voltage (VH) is impressed on the electrode 56b, and the electric potential barrier to the vertical transfer channel 54 from the photo electric conversion elements 52 is eliminated by impressing a sufficient high voltage, and all the electric charges will move to the vertical transfer channel 54. Moreover, two vertical transfer channels 54 which are adjacent via the channel stop region 53 become high electric potential, although the channel stop region 53 divides them. Since the signal electric charges are accumulated in the vertical transfer channel 54 which is adjacent to the reading part 51c at the reading-out period, the signal charges that can be accumulated in the vertical channel 54 in terms of electric potential will not exceed the electric potential of the channel stop region 53.

FIG. 8 is an enlarged plan view showing a part enclosed with a double short-dashed line in FIG. 6A. In the drawing, S2 indicates a region of a channel formed by the electrode 56b at the reading-out period. An accumulation capacity at the reading-out period is decided approximately by a difference φa between the electric potential of the vertical transfer channel 54 that is adjoining to the reading part 51c shown in FIG. 7 and the electric potential barrier of the channel stop region 53 and an area of the S2 and a static capacity for the area per unit (the maximum accumulation capacity equals to or approximately equals to $\alpha S2\phi a$, when $\alpha$ is the static capacity for the area per unit).

In a case that this maximum accumulation capacity is smaller than the maximum accumulation capacity of the photo electric conversion element 52, the signal electric charges flow into an adjacent vertical transfer channel 54m over the electric potential barrier of the channel stop region 53, and it causes a blooming phenomenon that will deteriorate an image of a blight part as the solid-state imaging apparatus. That is, the dynamic range will be lost as a reduction of the dealing signal amount.

FIG. 9A to FIG. 9C are diagrams for explaining a conventional driving method of all pixel reading when electric charges are read out from the photo electric conversion elements 52 to the vertical transfer channel 54. In the drawing, a white circle represent an electric charge, and each electric charge corresponds to one of colors represented by letters "R, G, B" placed inside the circle. Moreover, a black painted part of the vertical transfer channel shows a state of a high electric potential when the black painted part can accumulate electric charges.

FIG. 9A shows an initial condition, each photo electric conversion element 52 accumulates electric signal charge corresponding either one of "R, G, B". From the initial condition, the electric charges (G signals) stored in the photo electric conversion elements 52 are read out to the vertical transfer channel 54 by impressing high level voltage (VH) to φV1 as shown in FIG. 9B. At this time, the electric charges may flow into adjacent vertical transfer channel 54 over a potential barrier of the channel stop region 53. Thereafter, the electric charges (R signals and B signals) stored in the photo electric conversion elements 52 are read out to the vertical transfer channel 54 by impressing high level voltage (VH) to φV3 as shown in FIG. 9C. At this time also, the electric charges may flow into adjacent vertical transfer channel 54 over a potential barrier of the channel stop region 53. Therefore, this inter-VCCD blooming phenomenon causes color mixture and, as a result of that, an image in a light part will be extremely deteriorated.

SUMMARY OF THE INVENTION

It is an object of the present invention to provide a solid state imaging apparatus that can prevent color mixture even when an inter-VCCD blooming is occurred.

According to one aspect of the present invention, there is provided a solid-state imaging apparatus, comprising: a semiconductor substrate defining a two-dimensional surface; a multiplicity of photo electric conversion elements positioned on lattice points of a first lattice of a tetragonal matrix and of a second lattice of which each lattice point is positioned at a center of the first lattice in a light receiving region of the semiconductor substrate; a vertical electric charge transfer device having a plurality of vertical electric charge transfer channels arranged vertically between rows of the photo electric conversion elements and a plurality of transfer electrodes horizontally arranged over the vertical electric charge transfer channels; and reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction, wherein the reading out electrode and at least one of transfer electrodes adjoining to the reading out electrode are adjoining to same photo electric conversion element, and electric charge accumulated in each photo electric conversion element is transferred by every other line of vertical electric charge transfer channels in the vertical direction.

According to another aspect of the present invention, there is provided a driving method of a solid-state imaging apparatus, comprising: a semiconductor substrate defining a two-dimensional surface; a multiplicity of photo electric conversion elements positioned on lattice points of a first lattice of a tetragonal matrix and of a second lattice of which each lattice point is positioned at a center of the first lattice in a light receiving region of the semiconductor substrate; a vertical electric charge transfer device having a plurality of vertical electric charge transfer channels arranged vertically between rows of the photo electric conversion elements and a plurality of transfer electrodes horizontally arranged over the vertical electric charge transfer channels; and reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction, wherein the reading out electrode and at least one of transfer electrodes adjoining to the reading out electrode are adjoining to same photo electric conversion element, the method is characterized by that electric charge accumulated in each photo electric conversion element is transferred by every other line of vertical electric charge transfer channels in the vertical direction.

According to the present invention, a solid state imaging apparatus that can prevent color mixture even when an inter-VCCD blooming is occurred can be provided.

DETAILED DESCRIPTION OF THE PREFERRED EMBODIMENTS

Figure 1:
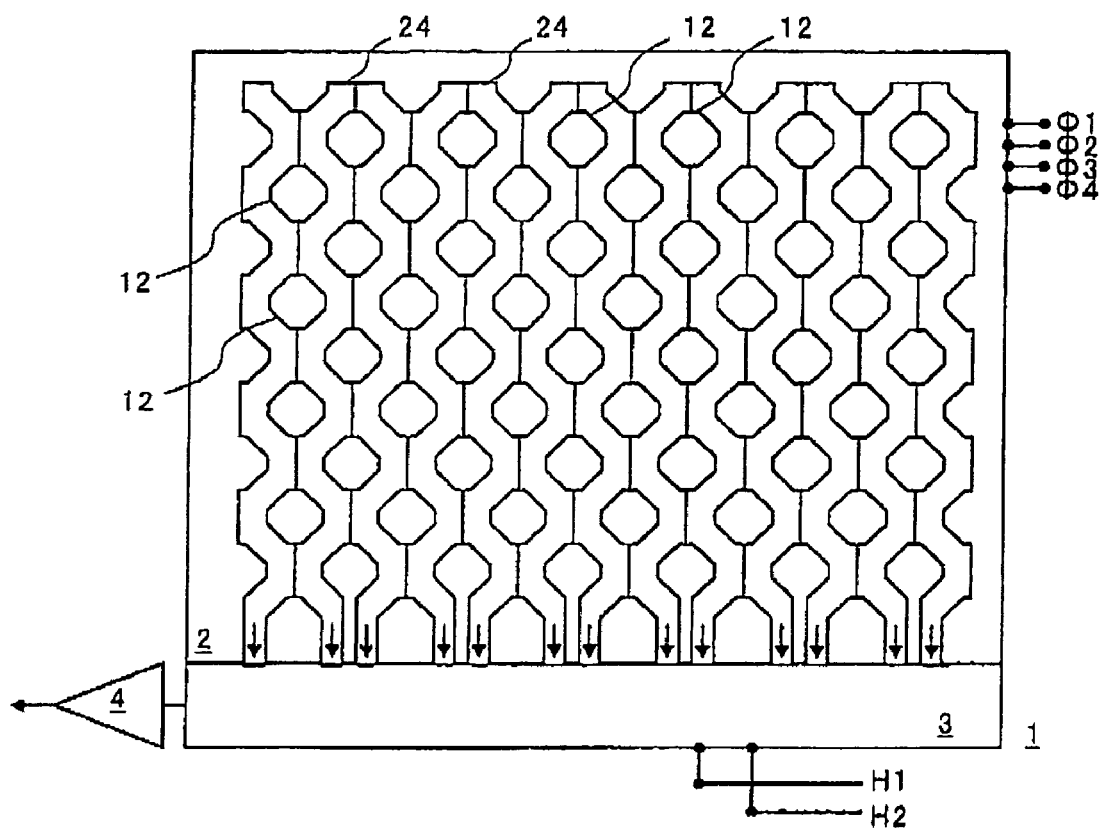
FIG. 1 is a schematic plan view showing a solid-state imaging apparatus 1 according to an embodiment of the present invention.

FIG. 1 is a schematic plan view showing a solid-state imaging apparatus 1 according to an embodiment of the present invention.

The solid-state imaging apparatus 1 is consisted of a light-receiving region 2 including a plurality of photo electric conversion elements 12 and a vertical signal electric charge transfer device (a vertical charge coupled device: VCCD) 24 transferring the signal electric charges generated by the photo electric conversion elements 12, a horizontal signal electric charge transfer device (a horizontal charge coupled device: HCCD) 3 transferring the signal electric charges transferred by the VCCD 24 to a horizontal direction and an output amplifier 4.

The light-receiving region 2 is consisted of the plurality of the photo electric conversion elements 12 by configuring them in the so-called pixel interleaved arrangement or the honeycomb arrangement. The pixel interleaved arrangement used in this specification indicates an arrangement combining the first lattice of a two-dimensional tetragonal matrix and the second lattice of the two-dimensional matrix of which each lattice point is positioned at the center of the first lattice. For example, the photo electric conversion elements 12 in the even numbered rows (lines) or columns and in the odd numbered rows (lines) or columns are shifted in the horizontal direction by about a half pitch of the photo electric conversion elements 12, and the photo electric conversion elements 12 in the even numbered lines (rows or columns) and in the odd numbered lines (rows or columns) are shifted in the vertical direction by about a half pitch of photo electric conversion elements 12. Each row of the photo electric conversion elements 12 includes the photo electric conversion elements 12 in either one of the even numbered rows and in the odd numbered row. Similarly, Each line of the photo electric conversion elements 12 includes the photo electric conversion elements 12 in either one of the even numbered lines and in the odd numbered line. The pixel interleaved arrangement is one of the arrangement styles for arranging a multiplicity of the photo electric conversion elements in a matrix having a plurality of rows and lines.

The phrase "about a half" represents a pitch including an exact half pitch and also a pitch regarded as substantially equal to the half pitch from the performance and image quality although this pitch is different from the exact half pitch because of manufacture tolerances, rounding errors of pixel positions caused from design or manufacturing of a mask or the like.

The vertical electric charge transferring device 24 that reads out the signal electric charges generated by the photo electric conversion elements 12 and vertically transfers them are formed between columns of the photo electric conversion elements 12 by vertically traversing between spaces of the photo electric conversion elements 12. Transfer channels 14 are positioned in the zigzag spaces formed by the pixel interleaved arrangement, and the adjacent transfer channels 14 apart from each other via the photo electric conversion elements 12 and come closer to each other via the channel stop region 13 (FIG. 2).

Figure 2:
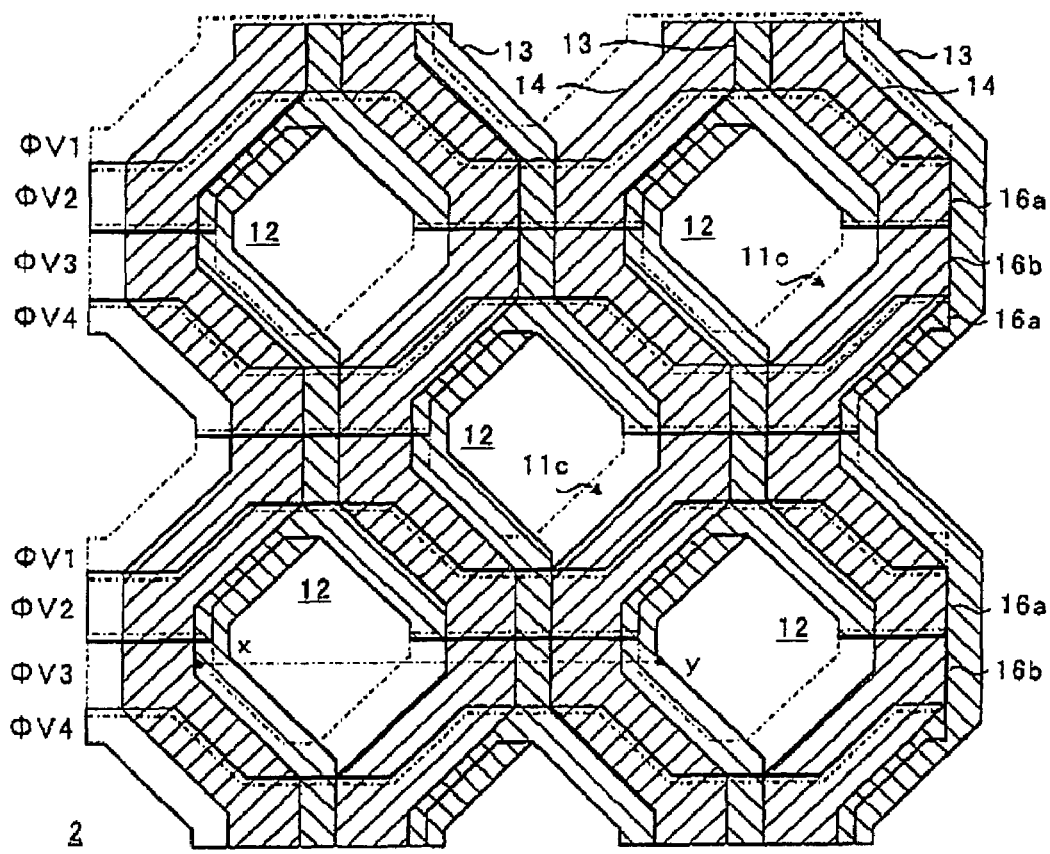
FIG. 2 is an enlarged plan view showing a part of a light-receiving region 2 of the solid-state imaging apparatus 1 according to the first embodiment of the present invention.

The vertical electric charge transfer device 24 is consisted of the vertical transfer channel 14 shown in FIG. 2 and transfer electrodes 16*a* and 16*b* (FIG. 2) which are formed over the vertical transfer channel 14 via an insulating film 10*a* (FIG. 3) and traversing between the photo electric conversion elements 12 to the horizontal direction.

FIG. 2 is an enlarged plan view showing a part of the light-receiving region 2 of the solid-state imaging apparatus 1 according to the first embodiment of the present invention, and shows a condition wherein the insulating film on the semiconductor substrate is peeled to expose the photo electric conversion elements 12 and the transfer electrodes 16.

Figure 3:
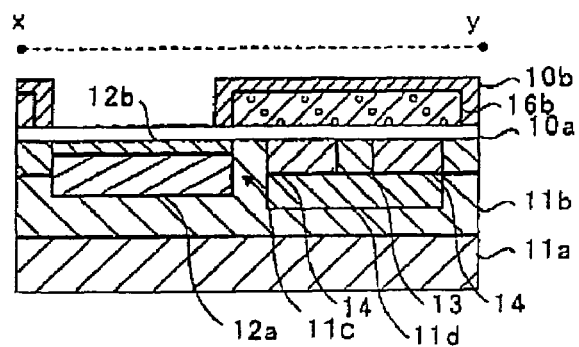
FIG. 3 is an enlarged cross sectional view of the solid-state imaging apparatus according to the first embodiment of the present invention.

FIG. 3 is an enlarged cross sectional view of the solid-state imaging apparatus 1 according to the first embodiment of the present invention. Moreover, this cross section shows the solid-state imaging apparatus cut across a single short-dashed line x-y in FIG. 2.

In the below-described explanation, in order to distinguish the degrees of impurity concentrations between impurity added regions having the same conductive type, it is transcribed as a p−−-type impurity added region, a p-type impurity added region and a p+-type impurity added region, or an n−−-type impurity added region, an n-type impurity added region and an n+-type impurity added region in sequence from the region that has relatively low in the impurity concentration. Except for a case that the p−−-type impurity added region 11*b* is formed by the epitaxial growing method, it is preferable that all the impurity added regions are formed by ion-implantation and a thermal treatment after that.

The semiconductor substrate 11 has, for example, an n−−-type silicon substrate 11*a* and the p−−-type impurity added region 11*b* formed in a surface of the substrate 11. The p−−-type impurity added region 11*b* is formed by the thermal treatment after the ion-implantation of p-type impurity on one surface of the n−−-type silicon substrate 11*a*, or performing the epitaxial growth of silicon containing p-type impurity on one surface of the n-type silicon substrate 11*a*.

Next, an n-type impurity added region (vertical transfer channels) 14 are formed in the p-type impurity added region 11*b* having a width of, for example, 0.5 μm corresponding to one row of the photo electric conversion elements 12 formed in the later process. Each of the vertical transfer channels 14 has flat impurity concentration in a longitudinal (vertical) direction, and extends along with the corresponding row of the photo electric conversion elements 12.

Next, a channel stop region 13 is formed adjoining to the vertical transfer channel 14 (on an opposite side of a reading gate channel region 11*c*). The channel stop region 13 is formed of, for example, p+-type impurity added region, trench isolation or local oxidation (LOCOS).

A part of the p-type impurity added region 11*c* is remained along with the right side of each photo electric conversion element 12 (n-type impurity added region 12*a*) formed in the later process. Each p-type impurity added region 11*c* is used as a channel region 11*c* for the reading gate.

Next, an oxide film (or an ONO film) 15 is formed on the surface of the semiconductor substrate 11. The ONO film is composed by a lamination layer formed by laminating, for example, a silicon oxide film (thermal oxidation film) with thickness of about 20 to 70 nm, a silicon nitride film with thickness of about 30 to 80 nm and a silicon oxide film with thickness of about 10 to 50 nm in this order. In FIG. 2, the oxide film 15 is represented with one layer for convenience of the explanation. Moreover, the above described oxide film 15 can also be formed with single oxide film ($SiO_2$).

Next, an electrode forming process is executed. In this process, a transfer electrode (multilayered poly-silicon electrode) 16 is formed on the oxide film 15. The first polycrystalline Si layer 16*a* is laminated with thickness of 0.2 μm to 3 μm (for example, 1 μm) on the oxide film 15 formed on the surface of the semiconductor substrate 1, and a photo-resist film is applied on a surface of the first polycrystalline Si layer 16*a*. Then, after patterning the photo-resist film to a predetermined pattern by photolithography (exposure and development), by using the patterned photo-resist film as a mask, the first polycrystalline layer 16*a* in an unmasked region (a region without the mask) is etched off by dry-etching (using chlorine-type gas) with strong anisotropy (high velocity of etching in vertical direction to the mask). By that, the first poly-silicon electrode 16*a* is formed.

Next, the Si surface is oxidized, and a $SiO_2$ film (the second oxide film) is formed on the first poly-silicon electrode 16*a* with thickness of 300 Å to 1000 Å. Moreover, the second polycrystalline Si layer 16*b* is laminated on the second oxide film with thickness of 0.2μ to 3 μm (for example, 1 μm) by using reducing CVD method or the like. Then, the patterning of the second polycrystalline Si layer 16b is performed by using the photolithography, and the second layer poly-silicon electrode 16b is formed. Moreover, at the cross section of this part, only the second layer poly-silicon electrode 16b is positioned over the vertical transfer channel 14. Also, two vertical transfer channels 14 are adjacent via the channel stop region 13.

Next, predetermined points of the p-type impurity added regions 11b are converted to the n-type impurity added region 12a by ion implantation. Moreover, the n-type impurity added region 12a functions as an electric charge accumulation region. By converting the surface layer part of the n-type impurity added region 12a to the p+-type impurity added region 12b by ion implantation, a photo electric conversion element 12 that is buried-type photo-diode is formed.

Next, an insulating film 10 is formed to cover the multi-layer poly-silicon electrodes 16 and a front surface of the silicon substrate 11, and a light shielding film (not shown in the drawing) is formed by laminating alloy consisted of two or more than two types of metals such as tungsten, aluminum, chrome, titan, molybdenum and the like by PVD or CVD. This light shielding film covers each transfer electrode 16 or the like and prevent unnecessary photo electric conversion in a region other than the photo electric conversion element 12. The light shielding film has one opening over each of the photo electric conversion element 12. Moreover, a passivation layer, a planarizing insulating layer, a color filter layer, the second planarizing film and micro lenses are formed on the light shielding film.

The driving method of the solid-state imaging apparatus 1 according to the embodiment of the present invention is explained in the below.

FIG. 4A to 4E are diagrams for explaining a driving method of the solid state imaging apparatus 1 when electric charges are read out from the photo electric conversion elements 12 to the vertical transfer channel 14 according to the embodiment of the present invention. In this embodiment, a two-field interlace operation is applied. In the drawing, a white circle represent an electric charge, and each electric charge corresponds to one of colors represented by letters "R, G, B" placed inside the circle. Moreover, a black painted part of the vertical transfer channel shows a state of a high electric potential when the black painted part can accumulate electric charges.

Figure 4A:
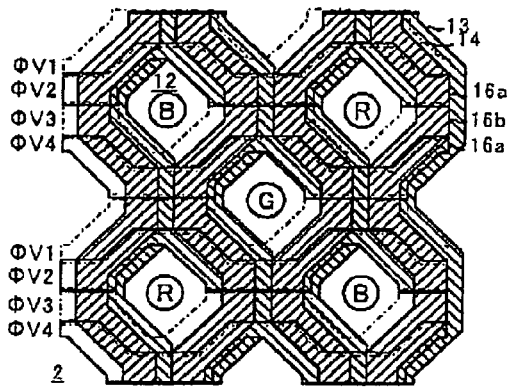
FIG. 4A to 4E are diagrams for explaining a driving method when electric charges are read out from the photo electric conversion elements 52 to the vertical transfer channel 54 according to the embodiment of the present invention.

FIG. 4A shows an initial condition, each photo electric conversion element 12 accumulates signal electric charge corresponding either one of "R, G, B".

Figure 4B:
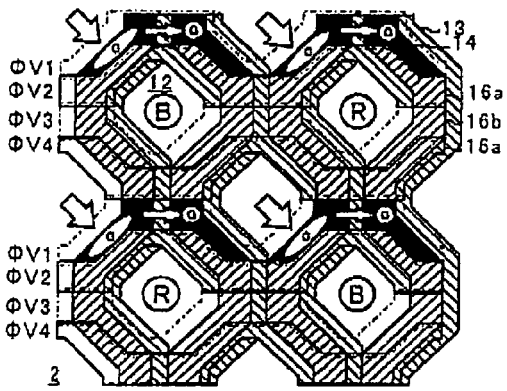
Figure 4D:
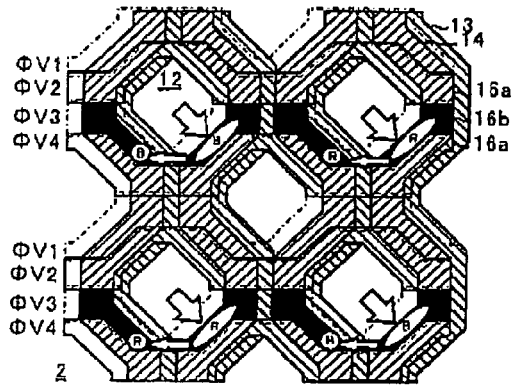
Figure 4C:
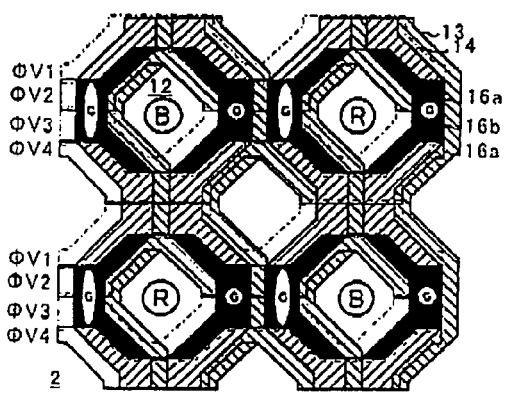

In this initial condition, at first, first field signal electric charges are read out. From the initial condition, the signal electric charges (G signals) stored in the photo electric conversion elements 12 are read out to the vertical transfer channel 14 by impressing high level voltage (VH) only to φV1 as shown In FIG. 4B. Thereafter, as shown in FIG. 4C, the signal electric charges (G signals) read out from the photo electric conversion elements 12 and signal electric charges overflowing into the next transfer channel are arranged alternatively in the horizontal direction and transferred in the vertical transfer channels 14. That is, the signal electric charges (G signals) read out from the photo electric conversion elements 12 are transferred to the vertical direction by every other line of the vertical transfer channels 14 in the horizontal direction. Thereafter, the signal electric charges (G signals) are transferred to the HCCD 3 by impressing pulses at middle level voltage (VM) and low level voltage (VL) in sequence to the transfer electrodes 16a to 16d in the transfer period. Between the transferring operations of the VCCD 24 during the transfer period, horizontal transferring operation of the HCCD 3 is executed by two-phase (HM/HL pulses) driving operation. The signal electric charges (G signals) transferred horizontally by the HCCD 3 are output as the first field signal electric charges.

Figure 4E:
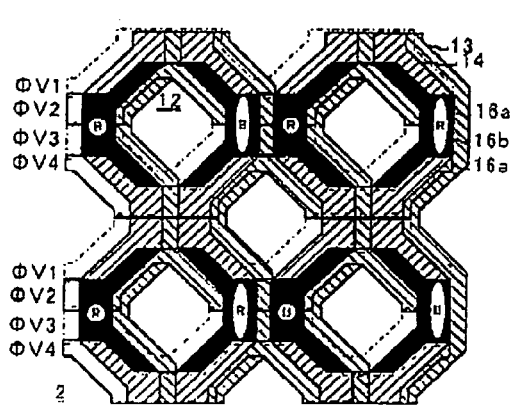
Figure 5:
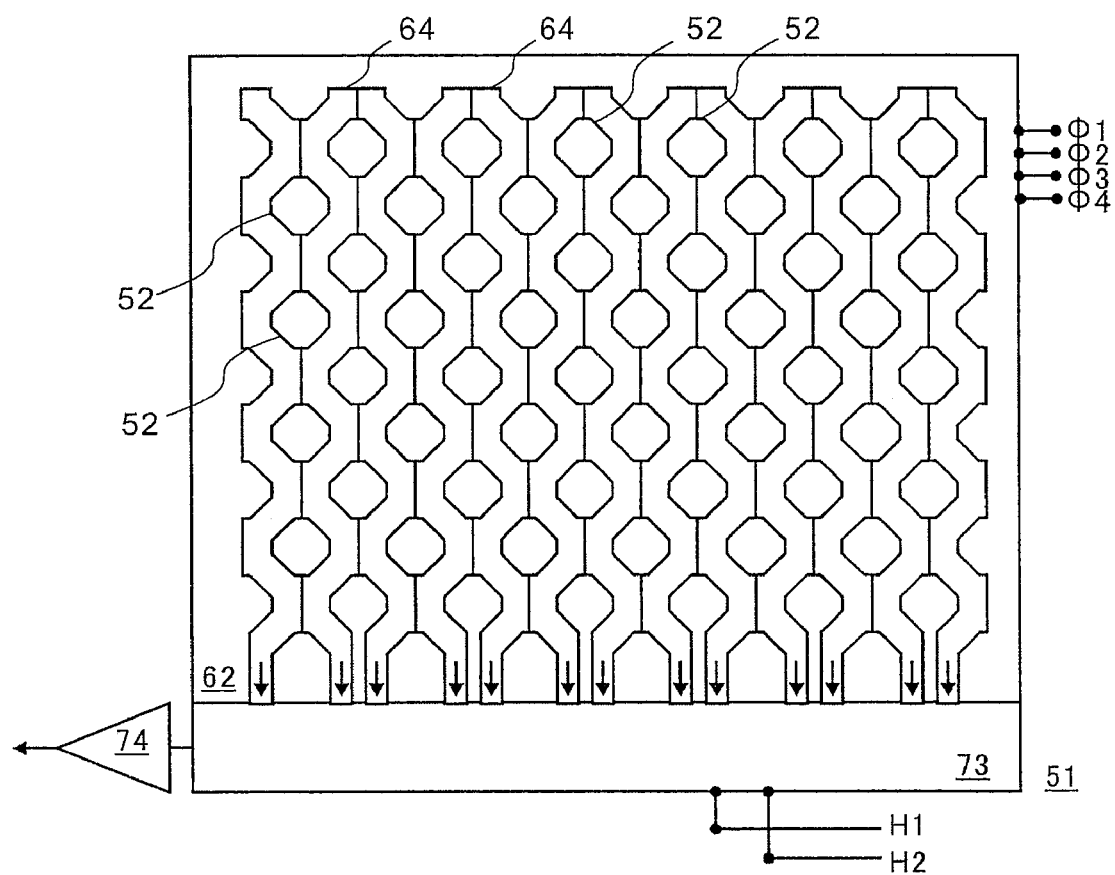
FIG. 5 is a schematic view showing a conventional solid-state imaging apparatus 51.
Figure 6A:
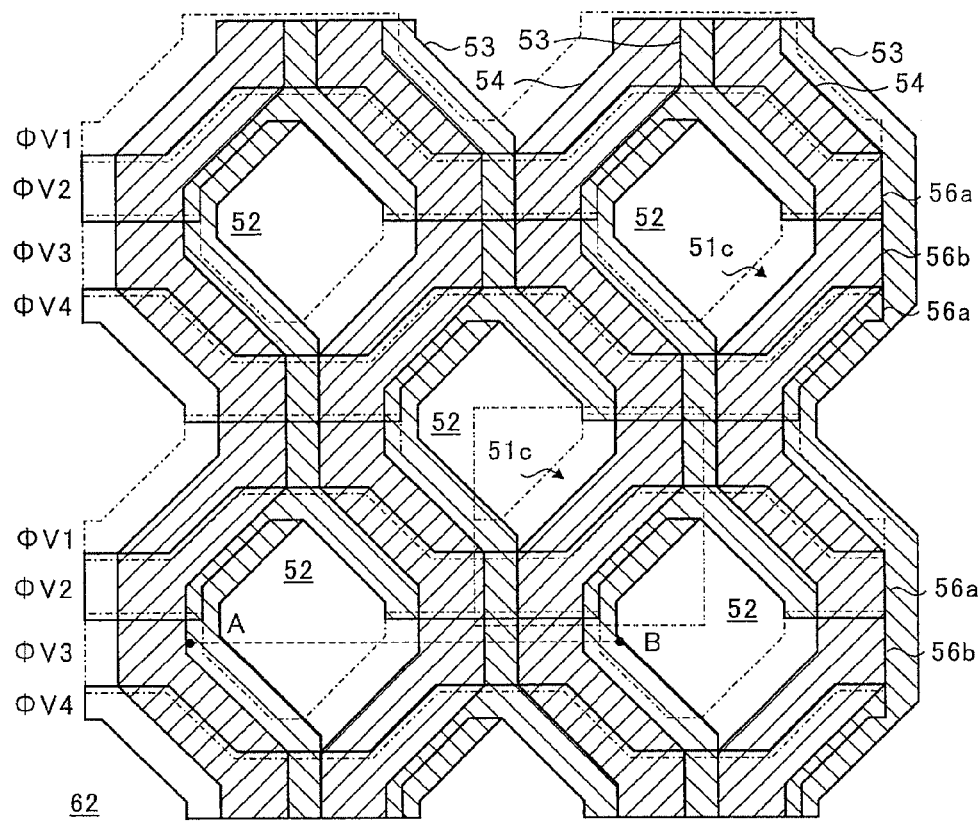
FIG. 6A is an enlarged plan view of the conventional solid-state imaging apparatus 51.
Figure 6B:
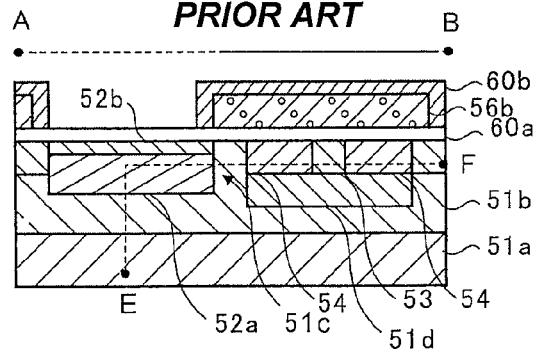
FIG. 6B is an enlarged cross sectional view showing a part of the light-receiving region 62 of the conventional solid-state imaging apparatus 51.
Figure 7:
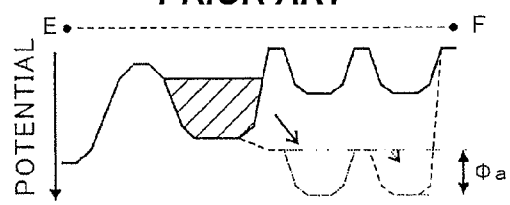
FIG. 7 shows an electric potential between a broken line E-F in FIG. 6B.
Figure 8:
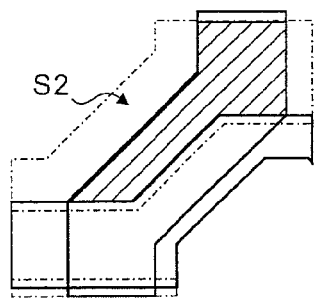
FIG. 8 is an enlarged plan view showing a part enclosed with a double short-dashed line in FIG. 6A.
Figure 9A:
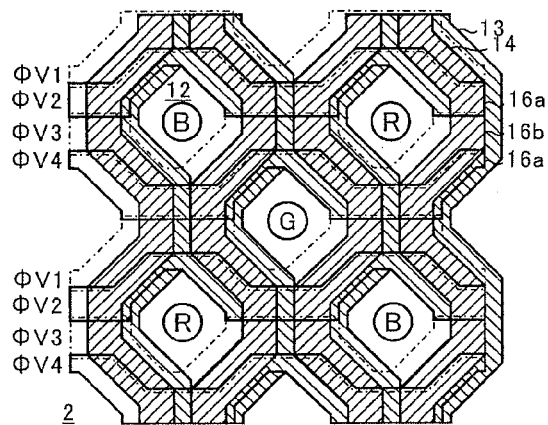
FIG. 9A to 9C are diagrams for explaining a conventional driving method of all pixel reading when electric charges are read out from the photo electric conversion elements 52 to the vertical transfer channel 54.
Figure 9B:
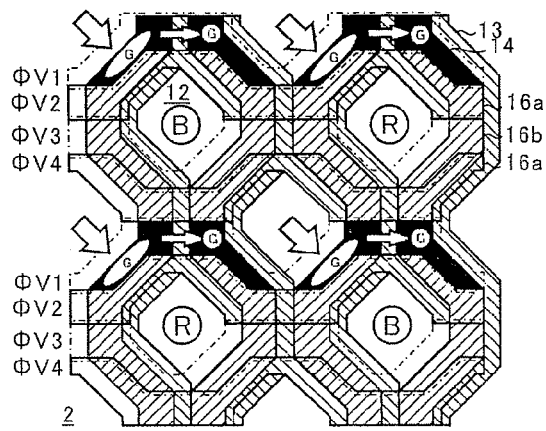
Figure 9C:
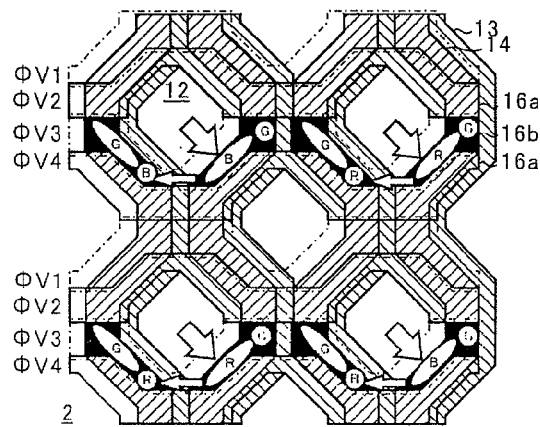

Next, second field signal electric charges are read out. The signal electric charges (R signals and B signals) stored in the photo electric conversion elements 12 are read out to the vertical transfer channel 14 by impressing high level voltage (VH) only to φV3 as shown in FIG. 4D. Thereafter, as shown in FIG. 4E, the signal electric charges (R signals and B signals) read out from the photo electric conversion elements 12 and signal electric charges overflowing into the next transfer channel are arranged alternatively in the horizontal direction and transferred in the vertical transfer channels 14. That is, the signal electric charges (R signals and B signals) read out from the photo electric conversion elements 12 are transferred to the vertical direction by every other line of the vertical transfer channels 14 in the horizontal direction. Thereafter, the signal electric charges (R signals and B signals) are transferred to the HCCD 3 by impressing pulses at middle level voltage (VM) and low level voltage (VL) in sequence to the transfer electrodes 16a to 16d in the transfer period. Between the transferring operations of the VCCD 24 during the transfer period, horizontal transferring operation of the HCCD 3 is executed by two-phase (HM/HL pulses) driving operation. The signal electric charges (R signals and B signals) transferred horizontally by the HCCD 3 are output as the first field signal electric charges.

Further, the signal electric charges that flew over into the next transfer channels are also transferred in another every other line of the vertical transfer channels 14 than said every other line of the vertical transfer channels 14 transferring the signal electric charges read out form the photo electric conversion elements 12, and said another every other line of the vertical transfer channels 14 transfers and accumulates only the signal electric charges that flew over into the next transfer channels; therefore, there will be no risk of color mixture. The transferred and output signal electric charges that flew over into the next transfer channels will be disregarded at the time of an image generation.

As described in the above, according to the embodiment of the present invention, when signal electric charges read out from the photo electric conversion elements 12 flew into the next vertical transfer channel by the blooming phenomenon, color mixture can be prevented by transferring the signal electric charges read out from the photo electric conversion elements 12 to the vertical direction by every other line of the vertical transfer channels 14 in the horizontal direction.

Although the transferred and output signal electric charges that flew over into the next transfer channels will be disregarded at the time of an image generation in the above-described embodiment, original signals before the signals flew into the next transfer channel can be revived by using the transferred and output signal electric charges that flew over into the next transfer channels. That is, whole signal electric charges that are photo electric converted by the photo electric conversion elements 12 can be detected, and a dynamic range can be improved.

In that case, for example, it can be considered that the signal electric charge read out from each photoelectric conversion element 12 is added with signal electric charge that flew into corresponding next transfer channel in the HCCD 3 or an output floating diffusion (output amplifier) 4. Further, the output signals may be added in digital values after A/D conversion.

Moreover, the above-described embodiment has been explained with the four-phase (φV1 to φV4) driving method;

however, the same effect can be obtained by the well-known eight-phase driving method or the six-phase driving method.

The present invention has been described in connection with the preferred embodiments. The invention is not limited only to the above embodiments. It is apparent that various modifications, improvements, combinations, and the like can be made by those skilled in the art.

What are claimed are:

1. A solid-state imaging apparatus, comprising:
a semiconductor substrate defining a two-dimensional surface;
a multiplicity of photo electric conversion elements positioned on lattice points of a first lattice of a tetragonal matrix and of a second lattice of which each lattice point is positioned at a center of the first lattice in a light receiving region of the semiconductor substrate;
a vertical electric charge transfer device having a plurality of vertical electric charge transfer channels arranged vertically between rows of the photo electric conversion elements and a plurality of transfer electrodes horizontally arranged over the vertical electric charge transfer channels; and
reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction,
wherein the reading out electrode and at least one of transfer electrodes adjoining to the reading out electrode are adjoining to same photo electric conversion element, and
electric charge accumulated in each photo electric conversion element is transferred by every other line of vertical electric charge transfer channels in the vertical direction.

2. A driving method for a solid-state imaging apparatus, comprising: a semiconductor substrate defining a two-dimensional surface; a multiplicity of photo electric conversion elements positioned on lattice points of a first lattice of a tetragonal matrix and of a second lattice of which each lattice point is positioned at a center of the first lattice in a light receiving region of the semiconductor substrate; a vertical electric charge transfer device having a plurality of vertical electric charge transfer channels arranged vertically between rows of the photo electric conversion elements and a plurality of transfer electrodes horizontally arranged over the vertical electric charge transfer channels; and reading out parts, each comprising a reading out electrode also serving as one of the transfer electrodes, corresponding to each one of the multiplicity of the photo electric conversion elements, and reading out a signal electric charge accumulated in the corresponding photo electric conversion element to the vertical electric charge transfer channels adjoining in a horizontal direction, wherein the reading out electrode and at least one of transfer electrodes adjoining to the reading out electrode are adjoining to same photo electric conversion element, the method is characterized by that electric charge accumulated in each photo electric conversion element is transferred by every other line of vertical electric charge transfer channels in the vertical direction.

* * * * *